US010319434B2

United States Patent
Jung et al.

(10) Patent No.: US 10,319,434 B2
(45) Date of Patent: Jun. 11, 2019

(54) STATIC RANDOM ACCESS MEMORY CELL CAPABLE OF PERFORMING DIFFERENTIAL OPERATION

(71) Applicant: INDUSTRY-ACADEMIC COOPERATION FOUNDATION, YONSEI UNIVERSITY, Seoul (KR)

(72) Inventors: Seong Ook Jung, Seoul (KR); Ju Hyun Park, Seoul (KR); Han Wool Jeong, Seoul (KR); Tae Woo Oh, Seoul (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 0 days.

(21) Appl. No.: 15/962,573

(22) Filed: Apr. 25, 2018

(65) Prior Publication Data
US 2018/0315472 A1 Nov. 1, 2018

(30) Foreign Application Priority Data

Apr. 26, 2017 (KR) .......................... 10-2017-0053963

(51) Int. Cl.
*G11C 11/412* (2006.01)
*G11C 11/419* (2006.01)
(Continued)

(52) U.S. Cl.
CPC ............ *G11C 11/419* (2013.01); *G11C 7/227* (2013.01); *G11C 8/10* (2013.01); *G11C 11/412* (2013.01); *G11C 11/418* (2013.01)

(58) Field of Classification Search
CPC ......... G11C 11/419; G11C 7/227; G11C 8/10; G11C 11/412; G11C 11/418
(Continued)

(56) References Cited

U.S. PATENT DOCUMENTS 6,992,915 B2 * 1/2006 Kang ..................... G11C 11/412
                                                        365/154
7,826,253 B2 * 11/2010 Takeda .................. G11C 11/412
                                                        365/156
(Continued)

FOREIGN PATENT DOCUMENTS

| KR | 1020080071815 A | 8/2008 |
| KR | 10-2016-0093456 A | 8/2016 |
| WO | 2015/147587 A1 | 10/2015 |

OTHER PUBLICATIONS

Koichi Takeda et al., "A Read-Static-Noise-Margin-Free SRAM Cell for Low-VDD and High-Speed Applications", IEEE Journal of Solid-State Circuits, vol. 41, No. 1, Jan. 2006.
(Continued)

*Primary Examiner* — Xiaochun L Chen
(74) *Attorney, Agent, or Firm* — Sughrue Mion, PLLC

(57) ABSTRACT

Disclosed is an SRAM cell capable of performing a differential operation. An SRAM cell according to an embodiment of the present disclosure may include a data node portion including four transistors constituting first and second data nodes; a data controller including first and second pass-gate transistors configured to control read and write of data in the first and second data nodes; and a control transistor connected to the data node portion through the second data node and configured to be controlled based on a driving voltage of a second word line having an opposite polarity to a first word line transmitting a driving voltage to the data controller.

15 Claims, 25 Drawing Sheets

(51) Int. Cl.
*G11C 8/10* (2006.01)
*G11C 11/418* (2006.01)
*G11C 7/22* (2006.01)

(58) Field of Classification Search
USPC .................................................. 365/189.14
See application file for complete search history.

(56) References Cited

U.S. PATENT DOCUMENTS

| 2004/0017711 | A1* | 1/2004 | Kang .................... G11C 11/412 |
| | | | 365/202 |
| 2009/0027947 | A1* | 1/2009 | Takeda .................. G11C 11/412 |
| | | | 365/156 |
| 2009/0161410 | A1 | 6/2009 | Houston |
| 2010/0020590 | A1 | 1/2010 | Hsueh et al. |
| 2016/0093365 | A1 | 3/2016 | Song et al. |

OTHER PUBLICATIONS

Communication dated Aug. 20, 2018, issued by the Korean Patent Office in counterpart Korean Application No. 10-2017-0053963.
Communication dated Dec. 20, 2018, issued by Korean Patent Office in counterpart Korean Patent Application No. 10-2017-0053963.

* cited by examiner

STATIC RANDOM ACCESS MEMORY CELL CAPABLE OF PERFORMING DIFFERENTIAL OPERATION

CROSS-REFERENCE TO RELATED APPLICATION

This application claims the priority benefit of Korean Patent Application No. 10-2017-0053963, filed on Apr. 26, 2017 in the Korean Intellectual Property Office, the disclosure of which is incorporated herein by reference.

BACKGROUND OF THE DISCLOSURE

Field of the Disclosure

The present disclosure relates to a static random access memory cell performing a read operation and a write operation for data, more particularly to a Static Random Access Memory (SRAM) cell which is capable of providing a balanced operation between a read operation and a write operation and reducing an area overhead.

Description of the Related Art

Static Random access memory is commonly used in integrated circuits. An SRAM cell has an advantage of maintaining data without requiring refreshing. An SRAM cell may include a plurality of transistors. For example, SRAM is referred to as a 6-transistor (6T) SRAM, an 8-transistor (8T) SRAM, or a 10-transistor (10T) SRAM depending upon the number of transistors. For example, SRAM is referred to as a PNN transistor, a PPN transistor, or the like according to a serial connection type of transistors. Transistors typically form a data latch for storing bits. Transistors may be added to control access to a transistor. SRAM cells are typically arranged in arrays of rows and columns. Each row of an SRAM cell is connected to a word line that determines whether an SRAM cell is selected. Each column of the SRAM cell is connected to a Bit Line (BL) or a complementary BL used to write bits to the SRAM cell or read bits from the SRAM cell.

Recently, there has been a problem that it is difficult to design a 6T SRAM capable of stably providing a read operation and a write operation in a balanced way. To address such a problem, a memory cell using additional transistors has been proposed.

With regard to a differential 10T SRAM cell, a method of suppressing the occurrence of read disturbance by removing a read disturbance using a read buffer in a read operation and simultaneously applying power to a word line in a horizontal direction and a word line in a vertical direction in a write operation to connect a storage node of a selected cell to a BL or a complementary BL has been proposed. However, in such a differential 10T SRAM cell, access transistors are connected in series and, accordingly, the strength of the transistor is low, whereby voltage is easily decreased or does not easily increase. In addition, since such a differential 10T SRAM uses 10 transistors, area overload may occur.

In the case of a PPN-based 10T SRAM cell, a write current flows through a path, where an n-type Metal Oxide Semiconductor (nMOS) and a p-type Metal Oxide Semiconductor (pMOS) are connected in series, during a write operation, whereby the write current is decreased and data is not transferred due to a drop in voltage, resulting in a reduction in write ability. In addition, since such a PPN-based 10T SRAM uses 10 transistors, area overload may occur.

RELATED ART DOCUMENTS

Patent Document (Patent Document 1) US Patent Application Publication No. 2016/0093365, entitled "SEVEN-TRANSISTOR STATIC RANDOM-ACCESS MEMORY BITCELL WITH REDUCED READ DISTURBANCE"

(Patent Document 2) US Patent Application Publication No. 2009/0161410, entitled "SEVEN TRANSISTOR SRAM CELL"

(Patent Document 3) Korean Patent Application Publication No. 10-2016-0093456, "SEMICONDUCTOR MEMORY"

SUMMARY OF THE DISCLOSURE

Therefore, the present disclosure has been made in view of the above problems, and it is one object of the present disclosure to provide an SRAM cell capable of performing a differential operation.

It is another object of the present disclosure to provide an SRAM cell configured to prevent a read disturbance of a row half-selected cell generated when a bit-interleaving structure is used to prevent a multi-soft error at low power.

It is another object of the present disclosure to provide an SRAM cell capable of providing improved write ability yield and frequency and reducing energy consumption, compared to conventional technologies.

It is another object of the present disclosure to provide an SRAM cell capable of providing a balanced operation between a read operation and a write operation.

It is another object of the present disclosure to provide an SRAM cell configured to perform a differential write operation by controlling an operation state of a control transistor through a word line connected to the control transistor.

It is another object of the present disclosure to provide an SRAM cell capable of preventing decrease in write efficiency due to a row half-selected cell.

It is another object of the present disclosure to provide an SRAM cell configured to determine a time where a voltage from a BL and a BL bar is sufficiently discharged within a range within which data of a row half-selected cell is not lost.

It is yet another object of the present disclosure to provide an SRAM cell configured to determine a switching time of a driving voltage of a control transistor satisfying a sufficient read stability yield of a row half-selected cell and a sufficient write ability yield of a selected cell.

In accordance with an aspect of the present disclosure, the above and other objects can be accomplished by the provision of a Static Random Access Memory (SRAM) cell including a data node portion including four transistors constituting first and second data nodes; a data controller including first and second pass-gate transistors configured to control read and write of data in the first and second data nodes; and a control transistor connected to the data node portion through the second data node and configured to be controlled based on a driving voltage of a second word line having an opposite polarity to a first word line transmitting a driving voltage to the data controller.

According to an embodiment of the present disclosure, the data node portion may include first and second pull-up transistors and first and second pull-down transistors.

In the SRAM cell according to an embodiment of the present disclosure, a drain terminal of the control transistor may be connected to a gate terminal of the first pull-up transistor, a gate terminal of the first pull-down transistor, and a source terminal of the second pull-up transistor through the second data node, a source terminal of the control transistor may be connected to a source terminal of the second pass-gate transistor and a drain terminal of the second pull-down transistor through a third data node, and a gate terminal of the control transistor may be connected to the second word line.

In the SRAM cell according to an embodiment of the present disclosure, gate terminals of the first and second pass-gate transistors may be connected to the first word line, a drain terminal of the first pass-gate transistor may be connected to a first Bit Line (BL), and a drain terminal of the second pass-gate transistor may be connected to a second BL.

In the SRAM cell according to an embodiment of the present disclosure, the first and second BLs may be precharged to a voltage corresponding to a positive value before a read operation.

According to an embodiment of the present disclosure, the SRAM cell may further include a word line driver configured to transmit a driving voltage corresponding to a negative value to the first word line and transmit a driving voltage corresponding to a positive value to the second word line in an initial state of operation.

According to an embodiment of the present disclosure, the word line driver may transmit the driving voltage corresponding to the positive value to the first word line and may transmit the driving voltage corresponding to the negative value to the second word line, at the start of a read operation.

In the SRAM cell according to an embodiment of the present disclosure, the control transistor may receive the driving voltage corresponding to the negative value through the second word line to be turned off at the start of the read operation, and the first and second pass-gate transistors may receive the driving voltage corresponding to the positive value through the first word line to be turned on at the start of the read operation.

In the SRAM cell according to an embodiment of the present disclosure, a charge from the first BL may be discharged through the first pass-gate transistor and the first pull-down transistor during a read operation for first data.

In the SRAM cell according to an embodiment of the present disclosure, the charge from the first BL may be introduced into the first data node, and may discharge a voltage of a third data node by increasing a voltage of the first data node, during the read operation for first data, and the second data node may maintain a voltage of the second data node according to turn-off of the control transistor when the voltage of the first data node increases and, accordingly, the voltage of the third data node is discharged.

According to an embodiment of the present disclosure, the SRAM cell may further include a read buffer portion configured to read the first data stored in the first data node using the voltage maintained in the second data node.

According to an embodiment of the present disclosure, the read buffer portion may read the second data using the voltage of the second data node maintained based on the turned-off state of the control transistor during a read operation for the second data.

In the SRAM cell according to an embodiment of the present disclosure, a charge from the second BL may be discharged through the second pass-gate transistor and the second pull-down transistor.

According to an embodiment of the present disclosure, the word line driver may transmit the driving voltage corresponding to the positive value to the first word line and may transmit the driving voltage corresponding to the negative value to the second word line, at the start of a write operation.

According to an embodiment of the present disclosure, the word line driver may switch the driving voltage transmitted to the second word line from the negative value to the positive value when at least one of the charge from the first BL and the charge from the second BL is discharged for a predetermined time.

According to an embodiment of the present disclosure, the SRAM cell may further include a signal delay processor configured to control write yield delay based on at least one inverter included in a write yield delay controller and control read yield delay based on at least one inverter included in a read yield delay controller.

According to an embodiment of the present disclosure, the signal delay processor may share an inverter delay line with a circuit generating a Sense Amplifier Enable (SAE) signal and a Word Line Enable (WLEN) signal.

In accordance with another aspect of the present invention, there is provided a method of controlling an SRAM cell, the SRAM cell including a data node portion including four transistors constituting first and second data nodes; a data controller including first and second pass-gate transistors configured to control read and write of data in the first and second data nodes; and a control transistor connected to the data node portion through the second data node and configured to be controlled based on a driving voltage of a second word line having an opposite polarity to a first word line transmitting a driving voltage to the data controller, wherein a word line driver switches a driving voltage transmitted to the second word line from a negative value to a positive value when at least one of a charge from a first BL and a charge from a second BL is discharged for a predetermined time.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1:
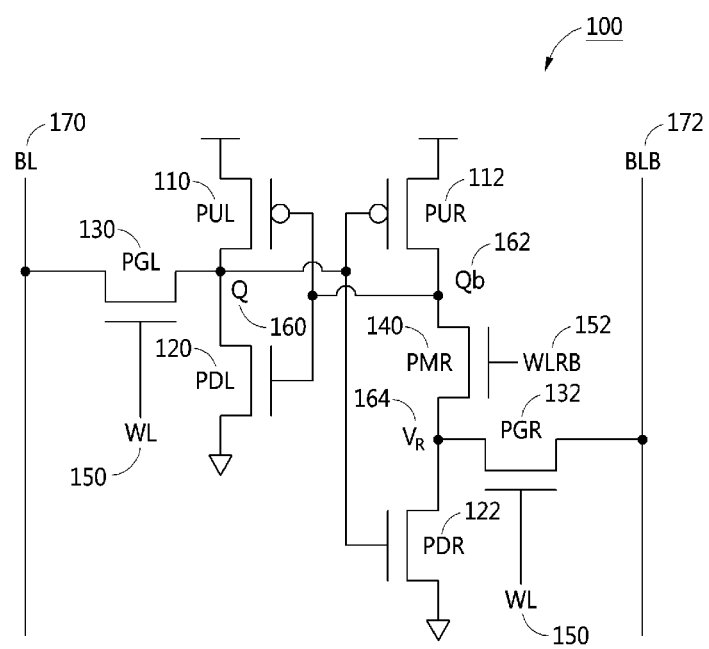
FIG. 1 illustrates an SRAM cell according to an embodiment of the present disclosure.

The present invention will now be described more fully with reference to the accompanying drawings, in which exemplary embodiments of the invention are shown.

This invention, however, should not be construed as limited to the exemplary embodiments and terms used in the exemplary embodiments, and should be understood as including various modifications, equivalents, and substituents of the exemplary embodiments.

Preferred embodiments of the present invention are now described more fully with reference to the accompanying drawings. In the description of embodiments of the present invention, certain detailed explanations of related known functions or constructions are omitted when it is deemed that they may unnecessarily obscure the essence of the invention.

In addition, the terms used in the specification are defined in consideration of functions used in the present invention, and can be changed according to the intent or conventionally used methods of clients, operators, and users. Accordingly, definitions of the terms should be understood on the basis of the entire description of the present specification.

In the drawings, like reference numerals in the drawings denote like elements.

As used herein, the singular forms "a," "an" and "the" are intended to include the plural forms as well, unless context clearly indicates otherwise.

Expressions such as "A or B" and "at least one of A and/or B" should be understood to include all possible combinations of listed items.

Expressions such as "a first," "the first," "a second" and "the second" may qualify corresponding components irrespective of order or importance and may be only used to distinguish one component from another component without being limited to the corresponding components.

In the case in which a (e.g., first) component is referred as "(functionally or communicatively) connected" or "attached" to another (e.g., second) component, the first component may be directly connected to the second component or may be connected to the second component via another component (e.g., third component).

In the specification, the expression " . . . configured to . . . (or set to)" may be used interchangeably, for example, with expressions, such as " . . . suitable for . . . ," " . . . having ability to . . . ," " . . . modified to . . . ," " . . . manufactured to . . . ," " . . . enabling to . . . ," or " . . . designed to . . . ," in the case of hardware or software depending upon situations.

In any situation, the expression "a device configured to . . . " may refer to a device configured to operate "with another device or component."

For examples, the expression "a processor configured (or set) to execute A, B, and C" may refer to a specific processor performing a corresponding operation (e.g., embedded processor), or a general-purpose processor (e.g., CPU or application processor) executing one or more software programs stored in a memory device to perform corresponding operations.

In addition, the expression "or" means "inclusive or" rather than "exclusive or."

That is, unless otherwise mentioned or clearly inferred from context, the expression "x uses a or b" means any one of natural inclusive permutations.

FIG. 1 illustrates an SRAM cell according to an embodiment of the present disclosure.

In particular, FIG. 1 exemplifies components of an SRAM cell according to an embodiment of the present disclosure.

Referring to FIG. 1, an SRAM cell 100 includes a first pull-up transistor 110, a second pull-up transistor 112, a first pull-down transistor 120, a second pull-down transistor 122, a first pass-gate transistor 130, a second pass-gate transistor 132, and a control transistor 140.

In accordance with an embodiment of the present disclosure, the SRAM cell 100 may include a data node portion that includes four transistors constituting a first data node 160 and a second data node 162. Here, the four transistors may include the first pull-up transistor 110, the second pull-up transistor 112, the first pull-down transistor 120, and the second pull-down transistor 122.

For example, the SRAM cell 100 may include a data controller that includes first and second path gate transistors 130 and 132 configured to control read and write of data in the first and second data nodes 160 and 162.

A drain terminal of the first pull-up transistor 110 may be connected to a drain voltage ($V_{dd}$), a gate terminal thereof may be connected to the second data node 162, and a source terminal thereof may be connected to the first data node 160.

A drain terminal of the second pull-up transistor 112 may be connected to a drain voltage, a gate terminal thereof may be connected to the first data node 160, and a source terminal thereof may be connected to the second data node 162.

For example, the drain voltage may include one of a positive value, a high value, and "1," and a source voltage ($V_{ss}$) may include one of a negative value, a low value, and "0." For example, the positive value may include a predetermined reference value or more between the drain voltage and the source voltage. In addition, the negative value may include a predetermined reference value or less between the drain voltage and the source voltage.

For example, the first and second pull-up transistors 110 and 112 may be turned off upon receiving the drain voltage $V_{dd}$ via the gate terminal, and may be turned on upon receiving the source voltage via the gate terminal.

A drain terminal of the first pull-down transistor 120 may be connected to the first data node 160, a gate terminal thereof may be connected to the second data node 162, and a source terminal thereof may be connected to a source voltage.

A drain terminal of the second pull-down transistor 122 may be connected to a third data node 164, a gate terminal thereof may be connected to the first data node 160, and a source terminal thereof may be connected to a source voltage.

For example, the first and second pull-down transistors 120 and 122 may be turned on upon receiving the drain voltage via the gate terminal, and turned off upon receiving the source voltage via the gate terminal.

A drain terminal of the first pass-gate transistor 130 may be connected to a first BL 170, a gate terminal thereof may be connected to a first word line 150, and a source terminal thereof may be connected to the first data node 160.

A drain terminal of the second pass-gate transistor 132 may be connected to a second BL 172, a gate terminal thereof may be connected to the first word line 150, and a source terminal thereof may be connected to the third data node 164.

For example, the first and second pass-gate transistors 130 and 132 may be turned on upon receiving a value of the first word line 150, as a positive value, via the gate terminal, and may be turned off upon receiving the value of the first word line 150, as a negative value, via the gate terminal.

For example, the positive value may include "1" and a high value, and the negative value may include "0" and a low value.

A drain terminal of the control transistor 140 may be connected to the second data node 162, a gate terminal may be connected to a second word line 152, and a source terminal thereof may be connected to the third data node 164.

That is, the drain terminal of the control transistor 140 may be connected to the gate terminal of the first pull-up transistor 110, the gate terminal of the first pull-down transistor 120, and the source terminal of the second pull-up transistor 122 via the second data node 162.

In addition, the source terminal of the control transistor 140 may be connected to the source terminal of the second pass-gate transistor 132 and the drain terminal of the second pull-down transistor 122 via the third data node 164.

For example, the control transistor 140 may be turned on upon receiving a value of the second word line 152, as a positive value, via the gate terminal, and may be turned off when receiving a value of the second word line 152, as a negative value, via the gate terminal.

In accordance with an embodiment of the present disclosure, when a value of the first word line 150 is a positive value, a value of the second word line 152 may be a negative value.

In accordance with an embodiment of the present disclosure, the SRAM cell 100 may receive a value of the first word line 150 as a source voltage and may receive a value of the second word line 152 as a drain voltage, in the initial state of an operation. Here, the drain voltage may include "1", a positive value, and a high value, and the source voltage may include "0", a negative value, and a low value.

In accordance with an embodiment of the present disclosure, the SRAM cell 100 may include the control transistor 140 controlled based on a driving voltage of the second word line 152 having an opposite polarity to the first word line 150 configured to transmit a driving voltage to the data controller including the first and second path gate transistors 130 and 132.

Figure 2A:
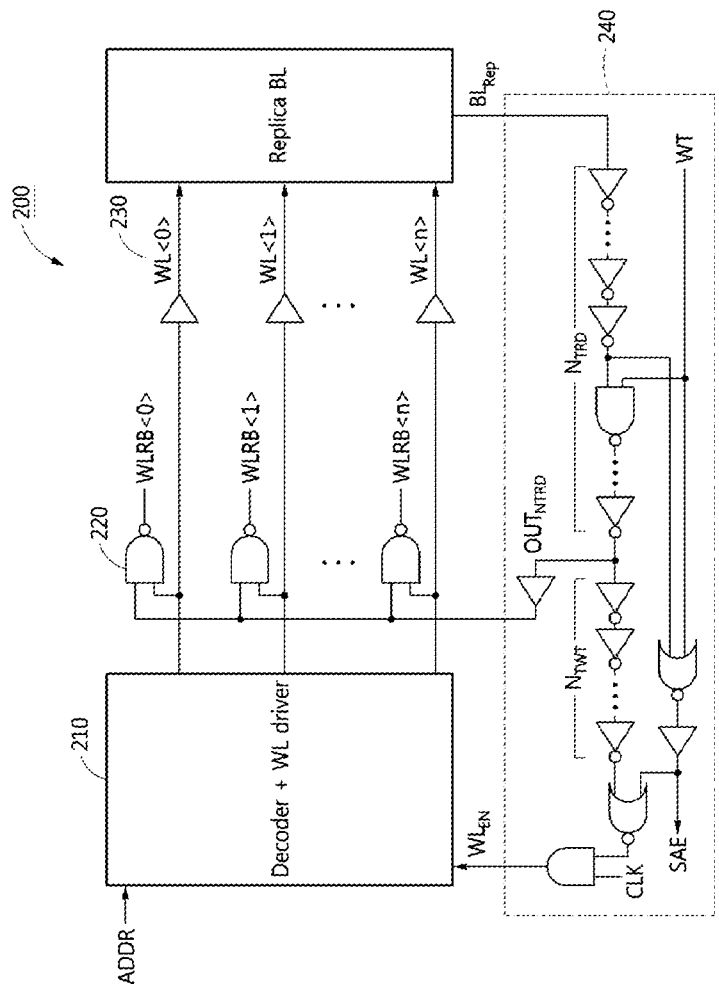
FIG. 2A illustrates a block diagram of a word line signal generator according to an embodiment of the present disclosure.

FIG. 2A illustrates a block diagram of a word line signal generator according to an embodiment of the present disclosure.

In particular, FIG. 2A exemplifies components of a word line signal generator according to an embodiment of the present disclosure.

Referring to FIG. 2A, the word line signal generator 200 includes a word line driver 210, a second word line signal provider 220, a first word line signal provider 230, and a signal delay processor 240.

In accordance with an embodiment of the present disclosure, the word line driver 210 may transmit a driving voltage corresponding to one of a positive value and a negative value to the second and first word line signal providers 220 and 230.

For example, the second word line signal provider 220 may convert a signal to provide a driving voltage corresponding to a negative value to a second word line, upon receiving a driving voltage corresponding to a positive value from the word line driver 210. On the other hand, the first word line signal provider 230 may provide a driving voltage corresponding to a positive value to a first word line upon receiving a driving voltage corresponding to a positive value from the word line driver 210.

That is, the second and first word line signal providers 220 and 230 may receive the same signal from the word line driver 210 to respectively provide driving voltages having different values to a gate terminal of a transistor connected to each thereof.

In accordance with an embodiment of the present disclosure, the signal delay processor 240 may generate a first delay signal related to read yield delay ($T_{RD}$) and a second delay signal related to write yield delay ($T_{WT}$).

In addition, the signal delay processor 240 may share an inverter delay line with a circuit generating a Sense Amplifier Enable (SAE) signal and a Word Line Enable (WLEN) signal.

In addition, the signal delay processor 240 may include a write yield delay controller ($N_{TWT}$) and a read yield delay controller ($N_{TRD}$).

In accordance with an embodiment of the present disclosure, the write yield delay controller may include at least one inverter and may determine write yield delay based on the number of the at least one inverter. In addition, the write yield delay controller includes inverters related to write yield delay where write yield delay is minimized and write capacity is saturated.

In accordance with an embodiment of the present disclosure, the read yield delay controller may include at least one inverter and one NAND gate and may determine read yield delay based on the number of the at least one inverter. In addition, the read yield delay controller may include inverters satisfying a target read stability yield.

In accordance with an embodiment of the present disclosure, the signal delay processor 240 may control write yield delay based on the at least one inverter included in the write yield delay controller, and may control read yield delay based on the at least one inverter included in the read yield delay controller.

In addition, the signal delay processor 240 may determine read yield delay and write yield delay. Here, the write yield delay is described in more detail when description of FIG. 5b is provided, and the read yield delay is described in more detail when description of FIG. 6b is described.

In accordance with an embodiment of the present disclosure, the word line driver 210 may transmit a driving voltage corresponding to a negative value to the first word line and may transmit a driving voltage corresponding to a positive value to the second word line, in an initial state of an SRAM cell.

For example, the word line driver 210 may transmit a driving voltage corresponding to a positive value to the first word line and may transmit a driving voltage corresponding to a negative value to the second word line, at the start of a read operation.

In accordance with an embodiment of the present disclosure, the word line driver 210 may transmit a driving voltage corresponding to a positive value to the first word line and may transmit a driving voltage corresponding to a negative value to the second word line, at the start of a write operation.

In accordance with an embodiment of the present disclosure, the word line driver 210 may transmit a driving voltage corresponding to a positive value to the first word line and may transmit a driving voltage corresponding to a positive value to the second word line, upon performing of a differential write operation.

Figure 2B:
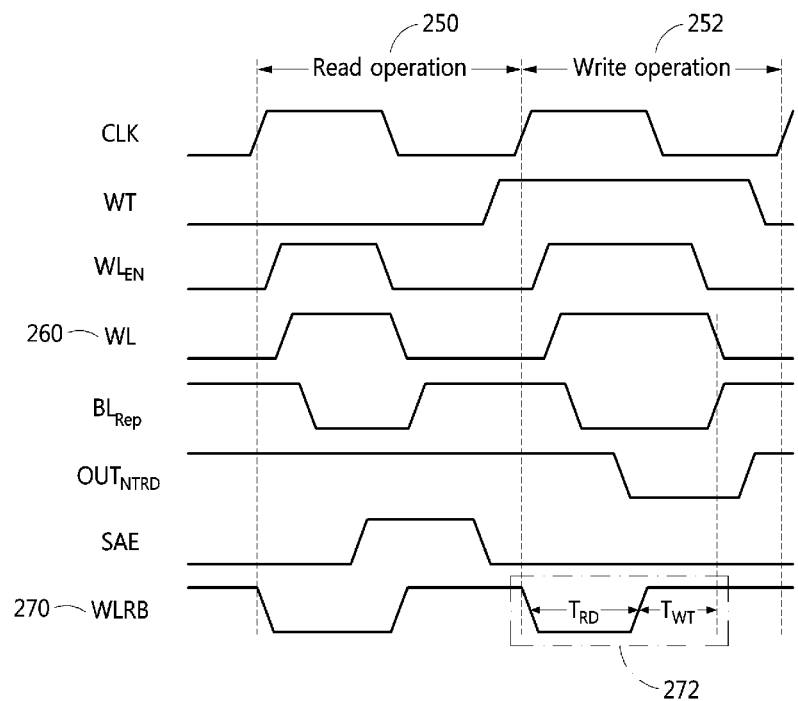
FIG. 2B is a timing chart illustrating word line signals according to an embodiment of the present disclosure.

FIG. 2B is a timing chart illustrating word line signals according to an embodiment of the present disclosure.

In particular, FIG. 2B exemplifies a timing chart of signals processed in a word line signal generator according to an embodiment of the present disclosure.

Referring to FIG. 2B, the timing chart includes a read operation 250 and a write operation 252 of an SRAM.

In accordance with an embodiment of the present disclosure, the word line signal generator may provide an input value, wherein a first word line 260 and a second word line 270 in the read operation 250 are opposite to each other, to the SRAM.

In addition, the word line signal generator may provide different driving voltages to the first and second word lines 260 and 270 in the write operation 252 and, during provision of the driving voltages, may change the driving voltage of the second word line 270 to be same as that of the first second word lines 260.

In addition, the word line signal generator may provide a first delay signal related to read delay as a negative value through the second word line 270 and provide a second delay signal related to write delay as a positive value to operate a differential write operation of the SRAM cell.

Figure 3A:
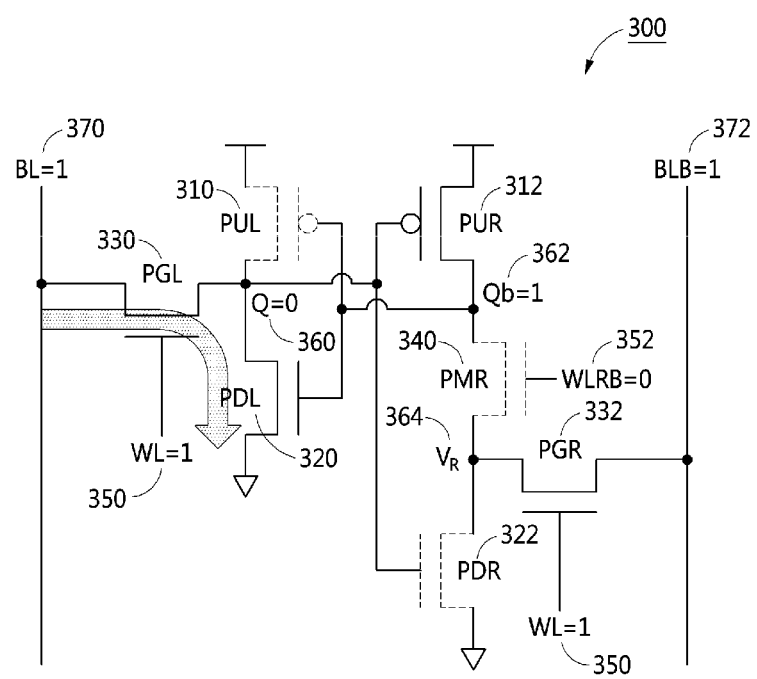
FIG. 3A illustrates a block diagram of an SRAM cell performing a read operation according to an embodiment of the present disclosure.

FIG. 3A illustrates a block diagram of an SRAM cell performing a read operation according to an embodiment of the present disclosure.

In particular, FIG. 3A exemplifies components of the SRAM cell according to an embodiment of the present disclosure when data "0" is read in the SRAM cell.

Referring to FIG. 3A, the SRAM cell 300 includes a first pull-up transistor 310, a second pull-up transistor 312, a first pull-down transistor 320, a second pull-down transistor 322, a first pass-gate transistor 330, a second pass-gate transistor 332, and a control transistor 340. Circuit connections between the components of the SRAM cell 300 may be the same as those illustrated in FIG. 1.

In accordance with an embodiment of the present disclosure, first and second BLs 370 and 372 in the SRAM cell 300 may be precharged to a drain voltage before a read operation. That is, the first and second BLs 370 and 372 may discharge a positive value.

In accordance with an embodiment of the present disclosure, the SRAM cell 300 may begin to operate when a driving voltage of a first word line 350 is converted from a negative value to a positive value and a driving voltage of a second word line 352 is converted from a positive value to a negative value.

That is, at the start of a read operation in the SRAM cell 300, a positive value may be input to the first word line 350, and a negative value may be input to the second word line 352.

In accordance with an embodiment of the present disclosure, the control transistor 340 may receive a value of the second word line 352 as a negative value through a gate terminal, thereby being turned off.

For example, the first and second pass-gate transistors 330 and 332 may receive a positive value through the first word line 350 to be turned on at the start of a read operation.

Here, a charge from the first BL 370 may be discharged through the first path-gate transistor 330 and the first pull-down transistor 320 upon a read operation for a first data corresponding to "0" or a negative value.

In accordance with an embodiment of the present disclosure, when a charge from the first BL 370 is discharged through the first path-gate transistor 330 and the first pull-down transistor 320, the second pull-down transistor 322 may be temporarily turned on according to a voltage increase in a first data node 360, so that the voltage of a third data node 364 may be discharged. However, the voltage of a second data node 362 may be maintained according to turn-off of the control transistor 340.

In addition, the SRAM cell may restore a first data previously stored in the voltage of the first data node 360 when a driving voltage of the first word line 350 is switched from a positive value to a negative value.

That is, the SRAM cell may read the first data stored in the first data node 360 using a voltage maintained in the second data node 362.

Figure 3B:
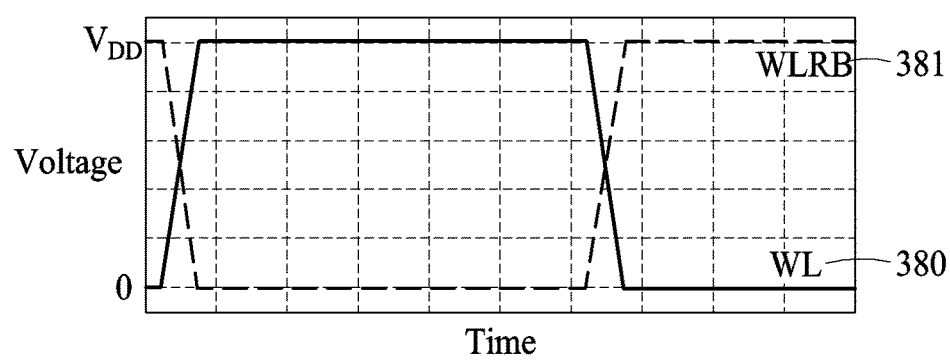
FIGS. 3B, 3C and 3D illustrate graphs related to voltage change in an SRAM cell performing a read operation according to an embodiment of the present disclosure.
Figure 3C:
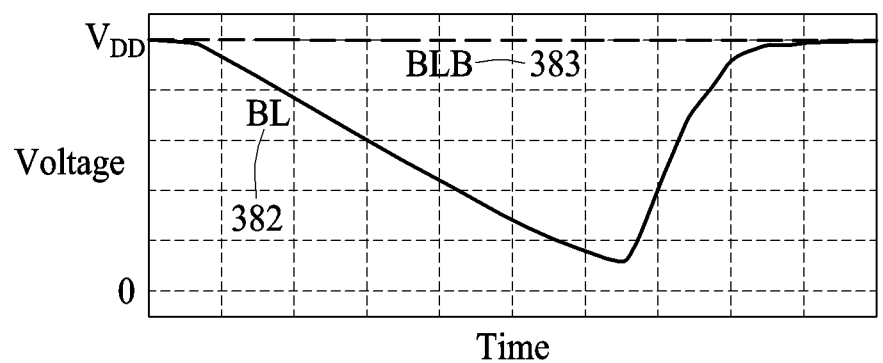
Figure 3D:
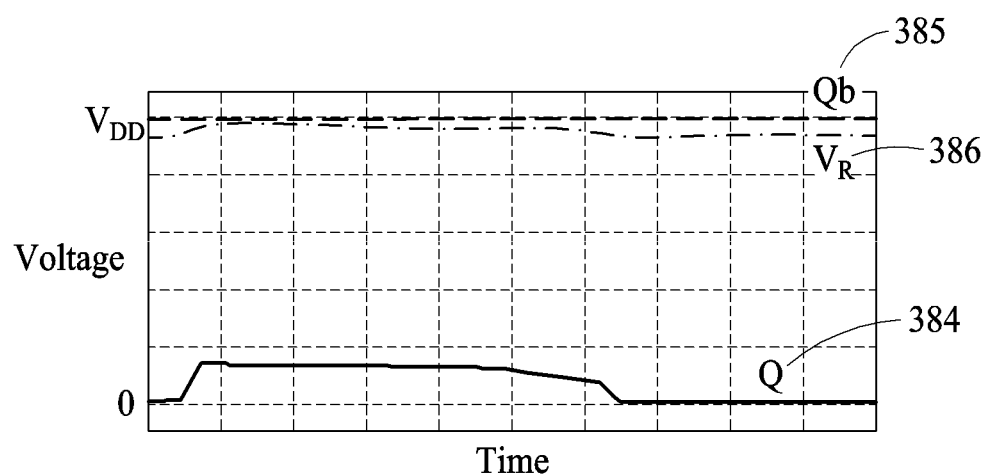

FIGS. 3B, 3C and 3D illustrate graphs related to voltage change in an SRAM cell performing a read operation according to an embodiment of the present disclosure.

In particular, FIGS. 3B, 3C and 3D are graphs illustrating voltage changes in a first BL dependent upon changes in first and second word line signals upon a read operation for "0."

Referring to FIG. 3B illustrates changes in a value 380 of a first word line and a value 381 of a second word line, FIG. 3C illustrates changes in a value 382 of a first BL and a value 383 of second BL, FIG. 3D illustrates a voltage value 384 of a first data node, a voltage value 385 of a second data node, and a voltage value 386 of a third data node.

In addition, a read buffer portion (not shown) may sense a change in the first BL value 382 to read data "0."

Figure 4A:
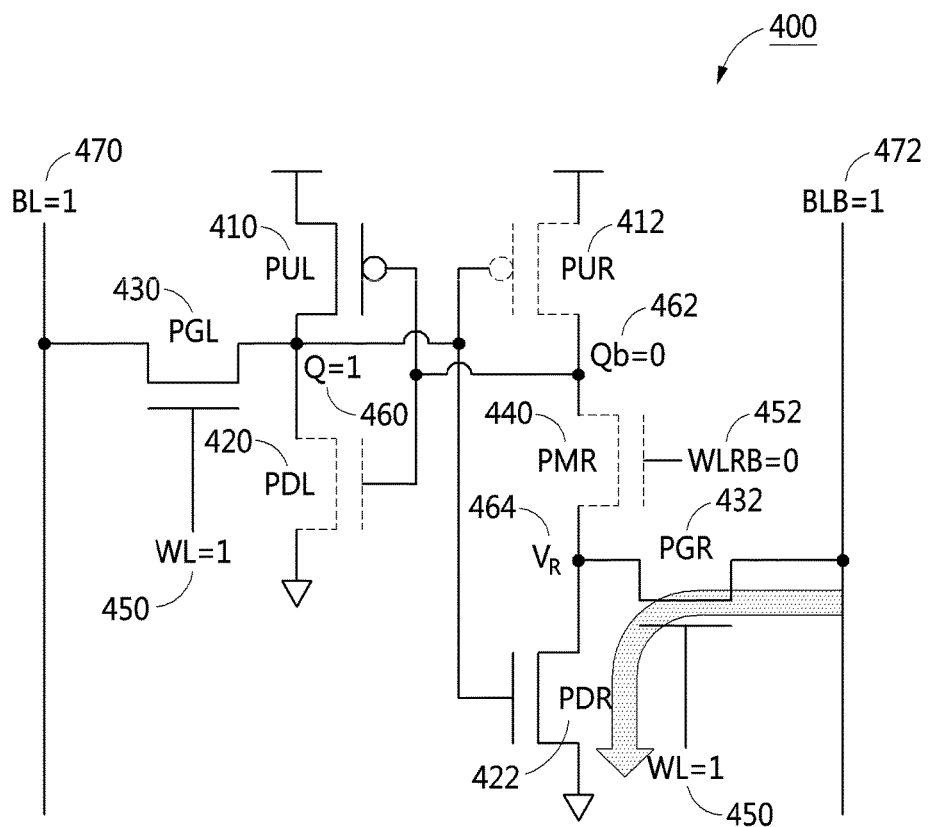
FIG. 4A illustrates a block diagram of an SRAM cell performing a read operation according to an embodiment of the present disclosure.

FIG. 4A illustrates a block diagram of an SRAM cell performing a read operation according to an embodiment of the present disclosure.

In particular, FIG. 4A exemplifies the components of the SRAM cell when the SRAM cell according to an embodiment of the present disclosure reads data "1." For example, data "1" may include second data.

Referring to FIG. 4A, the SRAM cell 400 includes a first pull-up transistor 410, a second pull-up transistor 412, a first pull-down transistor 420, a second pull-down transistor 422, a first pass-gate transistor 430, a second pass-gate transistor 432, and a control transistor 440. Circuit connections between the components of the SRAM cell 400 may be the same as those illustrated in FIGS. 1 and 2.

In accordance with an embodiment of the present disclosure, the SRAM cell 400 may begin to operate when a driving voltage of a first word line 450 is converted from a negative value to a positive value and a driving voltage of a second word line 452 is converted from a positive value to a negative value.

That is, at the start of a read operation in the SRAM cell 400, a positive value may be input to the first word line 450, and a negative value may be input to the second word line 452.

In accordance with an embodiment of the present disclosure, the control transistor 440 may receive a value of the second word line 452 as a negative value through a gate terminal, thereby being turned off.

For example, the first and second pass-gate transistors 430 and 432 may receive a positive value through the first word line 450 to be turned on at the start of a read operation.

Here, a charge from a second BL 472 may be discharged through the second path-gate transistor 432 and the second pull-down transistor 422 upon a read operation for a second data corresponding to "1" or a negative value.

In accordance with an embodiment of the present disclosure, when a charge from the second BL 472 is discharged through the second path gate transistor 432 and the second pull-down transistor 422, the control transistor 440 may be turned off, and thus, a third data node 464 might not charge a second data node 462, thereby read the second data.

That is, the SRAM cell may read the second data stored in a first data node using a voltage maintained in the second data node 462 through a read buffer portion (not shown).

Figure 4B:
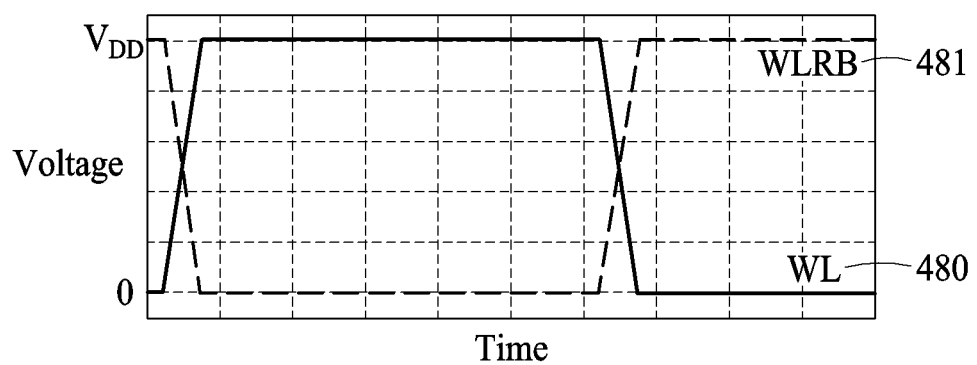
FIGS. 4B, 4C and 4D illustrate graphs related to voltage change in an SRAM cell performing a read operation according to an embodiment of the present disclosure.
Figure 4C:
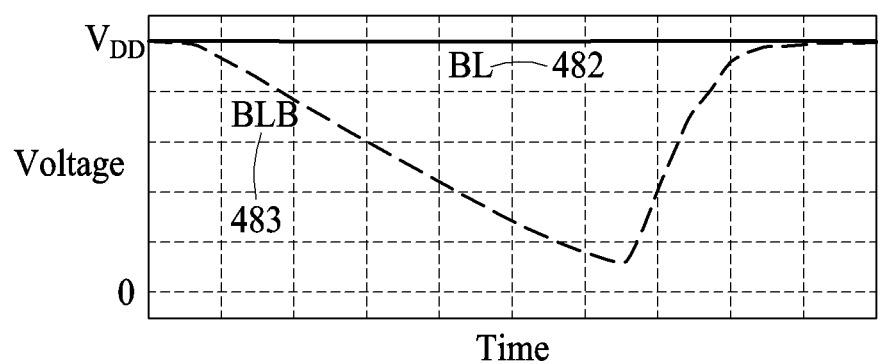
Figure 4D:
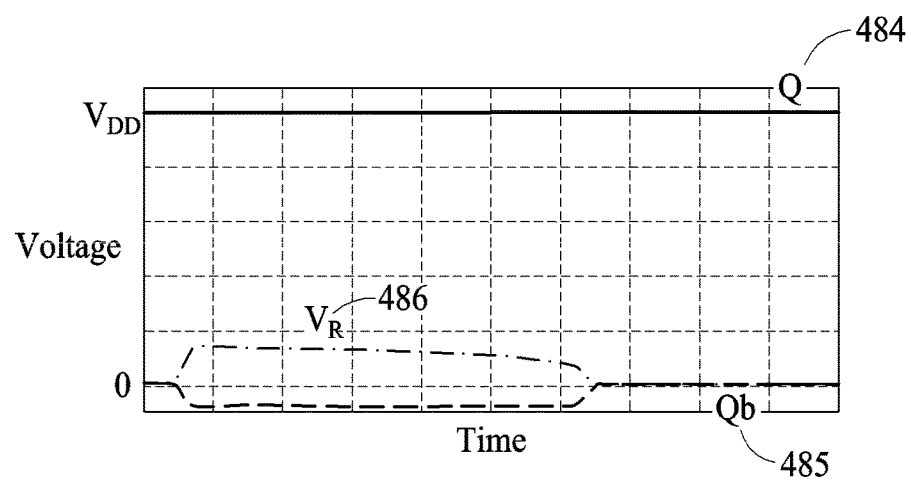

FIGS. 4B, 4C and 4D illustrate graphs related to voltage change in an SRAM cell performing a read operation according to an embodiment of the present disclosure.

In particular, FIGS. 4B, 4C and 4D are graphs illustrating voltage changes in a second BL dependent upon changes in first and second word line signals upon a read operation for "1."

Referring to FIG. 4B illustrates changes in a value 480 of a first word line and a value 481 of a second word line, FIG. 4C illustrates changes in a value 482 of a first BL and a value 483 of second BL, FIG. 4D illustrates a voltage value 484 of a first data node, a voltage value 485 of a second data node, and a voltage value 486 of a third data node.

In addition, a read buffer portion (not shown) may sense a change in the second BL value 483 to read data "1."

Figure 5A:
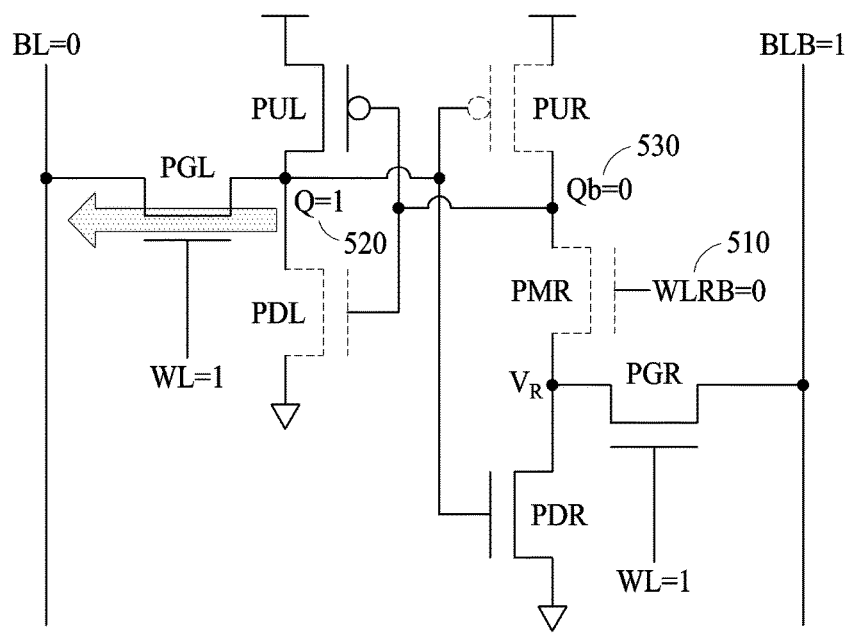
FIGS. 5A and 5B illustrate block diagrams of an SRAM cell performing a write operation according to an embodiment of the present disclosure.
Figure 5B:
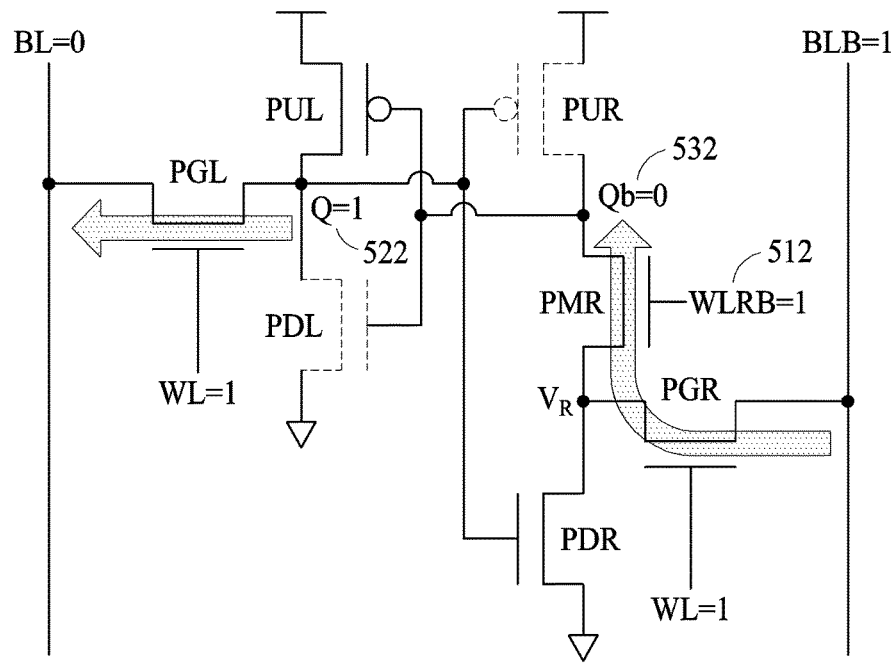

FIGS. 5A and 5B illustrate block diagrams of an SRAM cell performing a write operation according to an embodiment of the present disclosure.

In particular, referring to FIG. 5A exemplifies the components of the SRAM cell beginning to perform a write operation according to an embodiment of the present disclosure.

Referring FIG. 5A, the SRAM cell includes first and second pull-up transistors, first and second pull-down transistors, first and second pass-gate transistors, and a control transistor.

The SRAM cell begins to perform a write operation when a driving voltage for a first word line (WL) is switched from a source voltage to a drain voltage.

Here, a driving voltage for a second word line (WLRB) is switched from a drain voltage to a source voltage, the SRAM cell performs single-ended write operation, and a positive value corresponding to the voltage of a first data node 520 is output to a first BL through a first pass-gate transistor to perform a write operation.

In addition, FIG. 5B exemplifies components of an SRAM cell configured to change a driving voltage of a second word line according to an embodiment of the present disclosure to perform a differential write operation.

Referring to FIG. 5B, the SRAM cell includes first and second pull-up transistors, first and second pull-down transistors, first and second pass-gate transistors, and a control transistor.

In the SRAM cell, the control transistor switches a driving voltage of a second word line 512 from a negative value to a positive value through a gate terminal of the control transistor, thereby being turned on.

In the SRAM cell according to an embodiment of the present disclosure, as the control transistor is turned on, a charge from a second BL may be transmitted to a second data node 532.

In addition, the SRAM cell according to an embodiment of the present disclosure may switch an operation state of the control transistor from a turned off state to a turned on state by changing the driving voltage of the second word line, thereby performing a differential write operation.

For example, the SRAM cell may require a write delay section using the driving voltages of the first and second word lines as a drain voltage so as to perform a differential write operation.

In addition, when the write delay section is insufficient, write failure may occur. The write delay section is illustrated in a graph of FIG. 5b.

FIGS. 5C, 5D, 5E and 5F illustrate graphs related to voltage change in an SRAM cell performing a write operation according to an embodiment of the present disclosure.

In particular, FIGS. 5C, 5D, 5E and 5F exemplifie voltage changes in an SRAM cell performing a differential write operation according to an embodiment of the present disclosure.

In FIGS. 5C, 5D, 5E and 5F, a horizontal axis of each of the graphs represents time, and a vertical axis thereof represents a drain voltage. Here, when a drain voltage is high, it may be a positive value, and when a drain voltage is low, it may be a negative value.

Figure 5C:
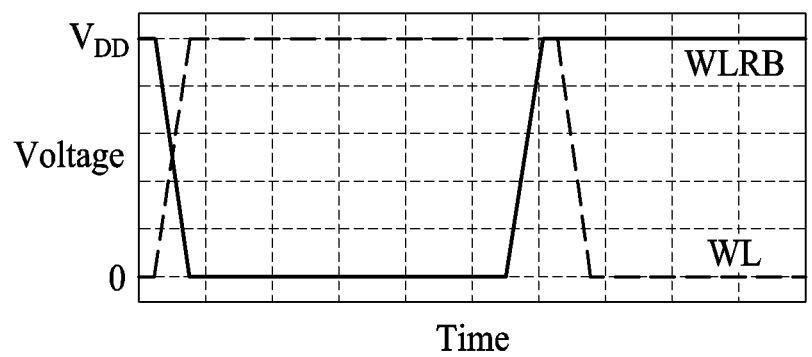
FIGS. 5C, 5D, 5E and 5F illustrate graphs related to voltage change in an SRAM cell performing a write operation according to an embodiment of the present disclosure.

FIG. 5C illustrates a driving voltage of a first word line and a driving voltage of a second word line at the start of a write operation.

Figure 5D:
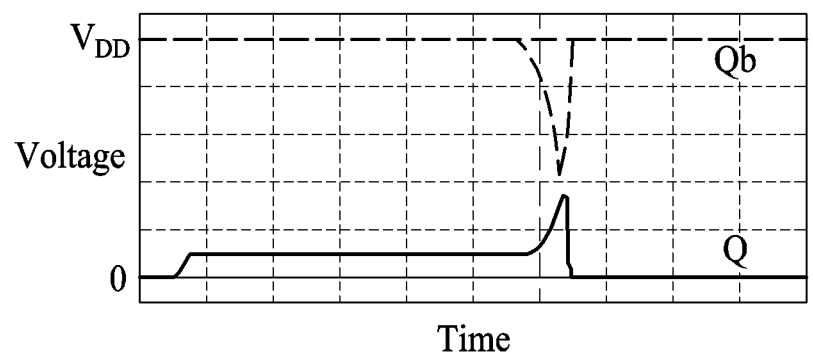

FIG. 5D illustrates a voltage of a first data node and a voltage of a second data node at the start of a write operation.

Figure 5E:
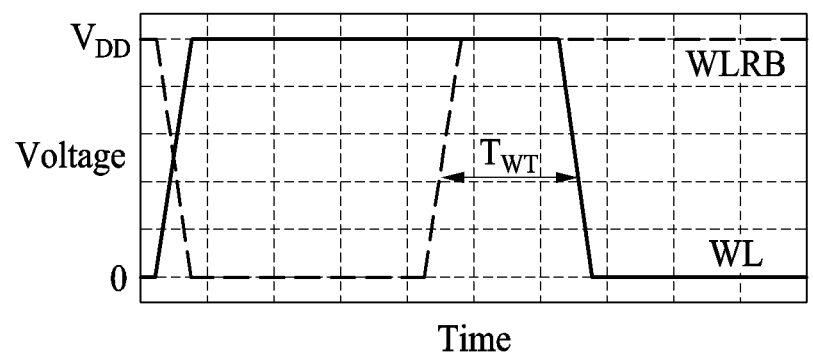

FIG. 5E illustrates a driving voltage of the first word line and a driving voltage of the second word line during a differential write operation, and a section related to a write delay ($T_{WT}$) where the driving voltage of the first word line and the driving voltage of the second word line become a drain voltage.

Figure 5F:
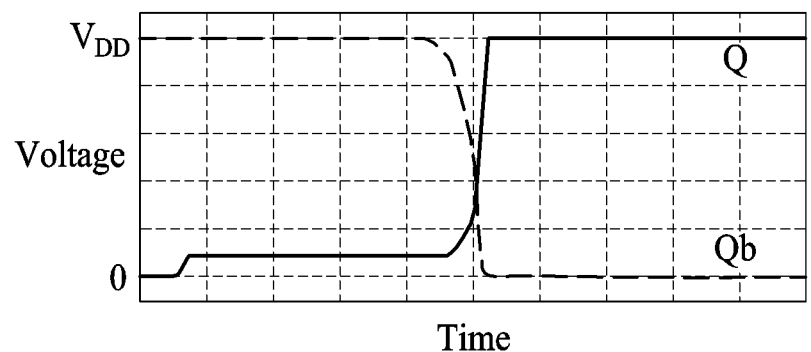

FIG. 5F illustrates a voltage of the first data node and a voltage of the second data node during a differential write operation.

Figure 6A:
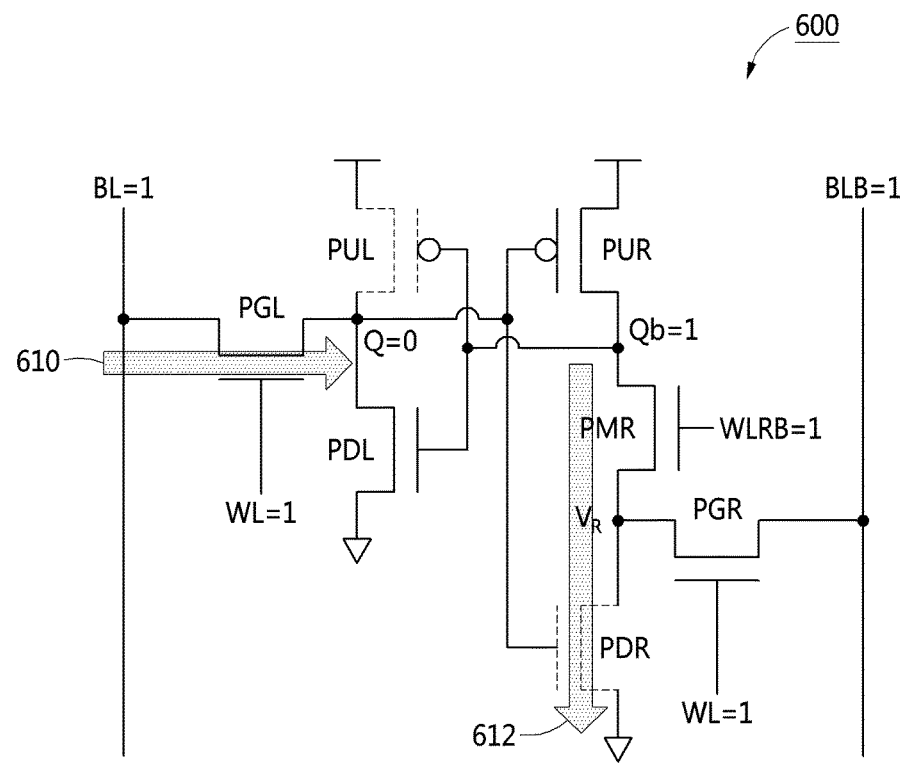
FIG. 6A illustrates a block diagram of an SRAM cell performing a write operation according to an embodiment of the present disclosure.
Figure 6B:
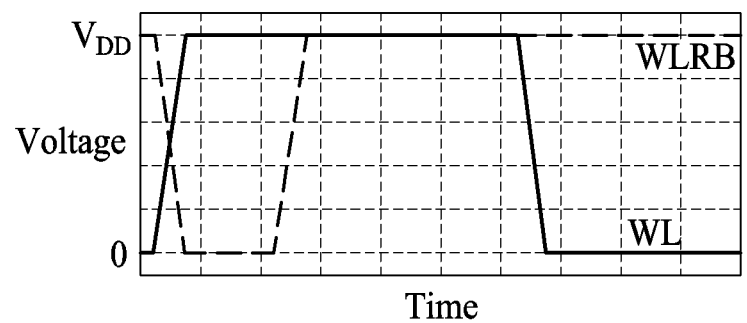
FIGS. 6B, 6C, 6D, 6E, 6F and 6G illustrate graphs related to voltage change in an SRAM cell performing a write operation according to an embodiment of the present disclosure.

FIG. 6A illustrates a block diagram of an SRAM cell performing a write operation according to an embodiment of the present disclosure.

In particular, FIG. 6A exemplifies disturbance due to a charge introduced from first and second BLs in an SRAM cell in a read operation according to an embodiment of the present disclosure.

Referring to FIG. 6A, in the SRAM cell according to an embodiment of the present disclosure, data of a row half-selected cell may be lost when a drain voltage is applied to the first word line and a drain voltage is applied to the second word line.

In particular, when the driving voltage applied to the first word line is a positive value and the driving voltage of the second word line is a positive value, data of a row half-selected cell, which is not located in a selected column, but is located in the same row as a selected cell, may be lost due to disturbance by the first and second BLs.

That is, in the row half-selected cell, a disturbance voltage 610 is introduced to a first data node to lose data of the first data node, and a voltage 612 of a second data node is discharged to lose data of the second data node.

Therefore, after discharging a charge from the first BL and a charge from the second BL for a predetermined time by switching a drain voltage transmitted from a selected cell to the second word line to a source voltage and, accordingly, turning off a control transistor, a source voltage transmitted from the second word line may be switched to a drain voltage.

In other words, the SRAM cell may switch the driving voltage transmitted to the second word line from a negative value to a positive value when at least one of a charge from first BL and a charge from the second BL is discharged until a time before data of the row half-selected cell is lost. That is, the SRAM cell may reset the driving voltage of the second word line to a drain voltage.

In addition, the SRAM cell may discharge the charge from the first BL and the charge from the second BL, without disturbance, in the row half-selected cell by applying a driving voltage of the second word line with a negative value when the driving voltage applied to the first word line is a positive value.

A time taken to discharge the charge from the first BL and the charge from the second BL, without data loss of the row half-selected cell, may be confirmed through graphs of FIG. 6b.

FIGS. 6B, 6C, 6D, 6E, 6F and 6G illustrate graphs related to voltage change in an SRAM cell performing a read operation according to an embodiment of the present disclosure.

In particular, FIGS. 6B, 6C, 6D, 6E, 6F and 6G exemplifie graphs related to voltage change in an SRAM cell performing a read operation according to an embodiment of the present disclosure. In the graphs, the horizontal axes represent time, and the vertical axes represent drain voltage.

FIG. 6B illustrates a driving voltage of a first word line and a driving voltage of a second word line when a driving voltage transmitted to the second word line is switched from a source voltage to a drain voltage without read yield delay.

Figure 6C:
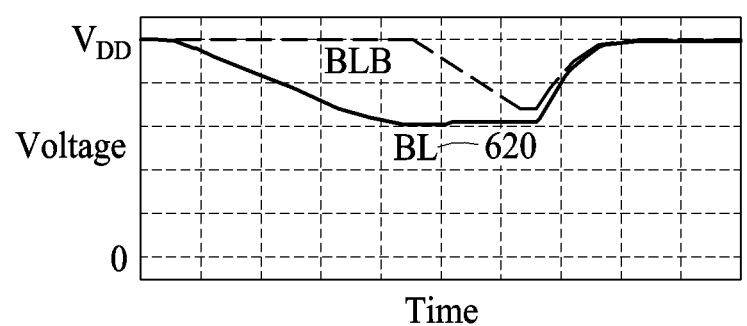

FIG. 6C illustrates a voltage 620 of a first BL and a voltage of a second BL when a voltage transmitted to the second word line is switched from a source voltage to a drain voltage without read yield delay.

Figure 6D:
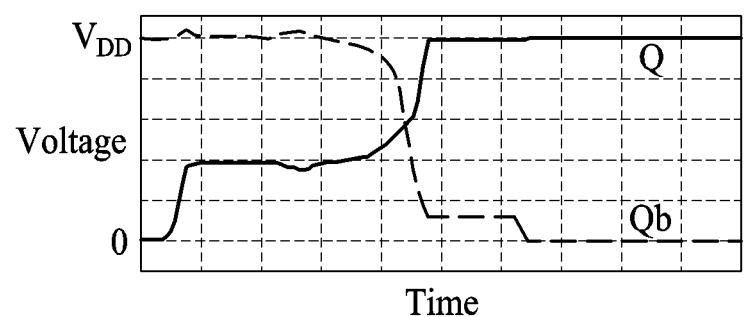

FIG. 6D illustrates voltages of first, second, and third data nodes when a voltage transmitted to the second word line is switched from a source voltage to a drain voltage without read yield delay.

Figure 6E:
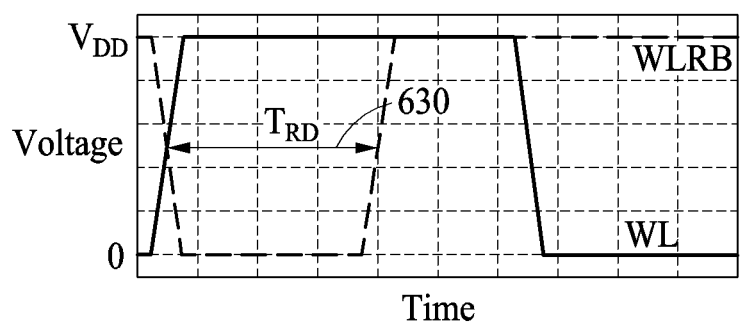

FIG. 6E illustrates a driving voltage of the first word line and a driving voltage of the second word line when a voltage transmitted to the second word line is switched from a source voltage to a drain voltage after the elapse of a read yield delay 630.

Figure 6F:
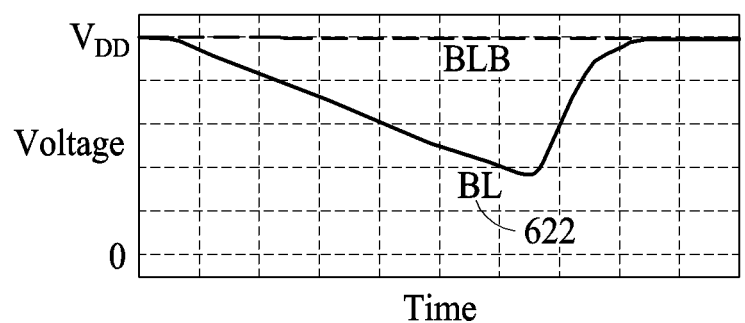

FIG. 6F illustrates a voltage 622 of the first BL and a voltage of the second BL when a voltage transmitted to the second word line is switched from a source voltage to a drain voltage after the elapse of the read yield delay 630.

Figure 6G:
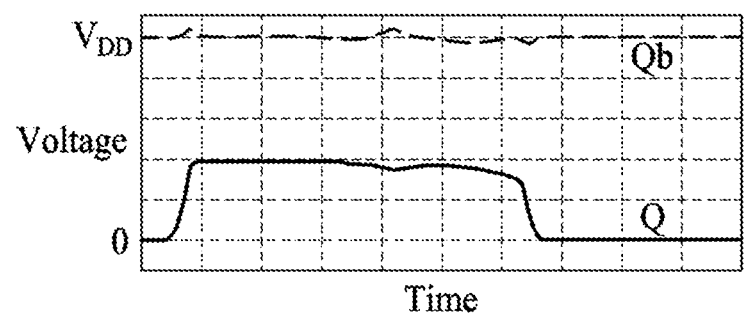

FIG. 6G illustrates voltages of first, second, and third data nodes when a voltage transmitted to the second word line is switched from a source voltage to a drain voltage after the elapse of the read yield delay 630.

Figure 7:
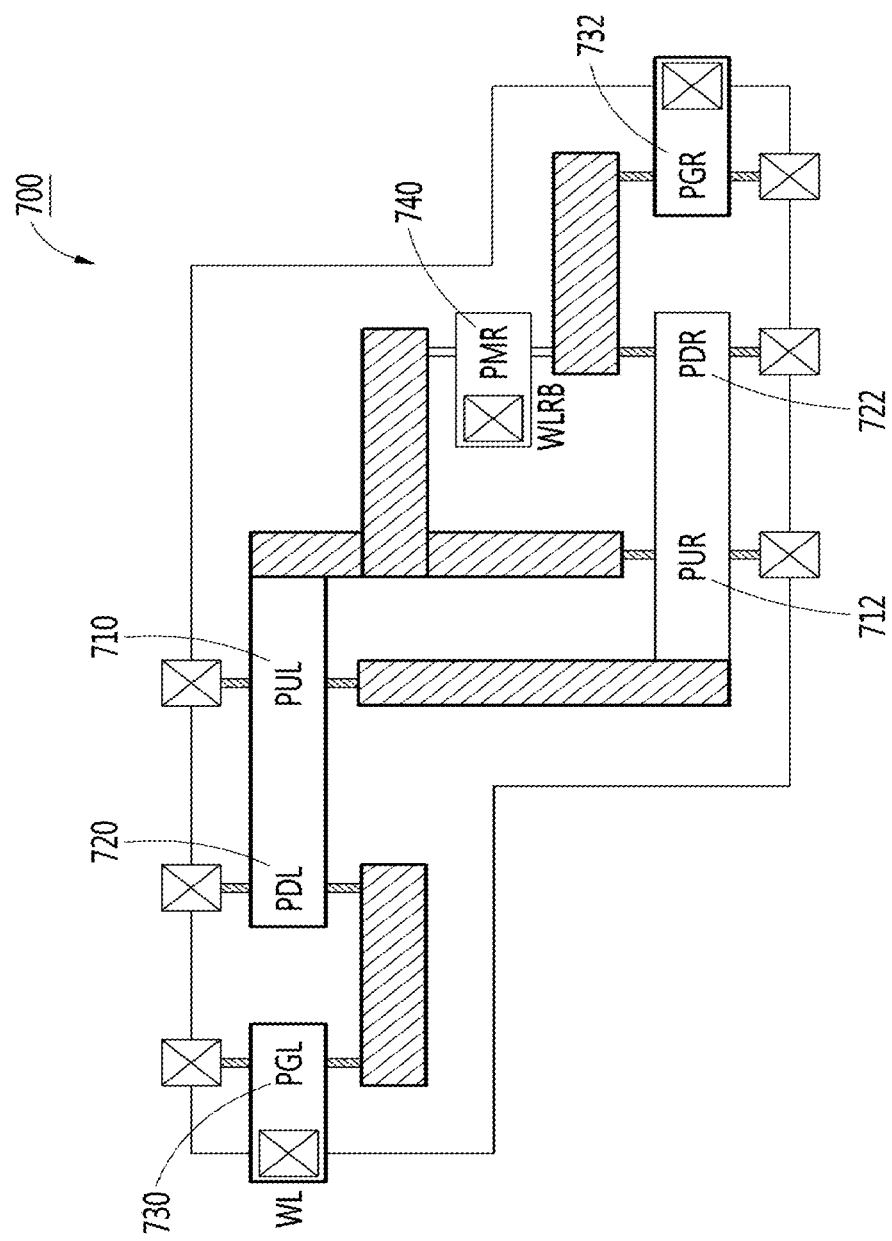
FIG. 7 illustrates a layout of an SRAM cell according to an embodiment of the present disclosure.

FIG. 7 illustrates a layout of an SRAM cell according to an embodiment of the present disclosure.

Referring to FIG. 7, an SRAM cell 700 includes a first pull-up transistor 710, a second pull-up transistor 712, a first pull-down transistor 720, a second pull-down transistor 722, a first pass-gate transistor 730, a second pass-gate transistor 732 and, a control transistor 740.

In accordance with an embodiment of the present disclosure, the SRAM cell 700 may reduce a BL capacitance, thereby reducing read delay.

As apparent from the above description, an SRAM cell according to an embodiment of the present disclosure may prevent a read disturbance of a row half-selected cell generated when a bit-interleaving structure is used to prevent a multi-soft error at low power.

In addition, the SRAM cell according to an embodiment of the present disclosure may provide improved write ability yield and frequency and reduce energy consumption, compared to conventional technologies.

In addition, the SRAM cell according to an embodiment of the present disclosure may provide an SRAM cell capable of providing a balanced operation between a read operation and a write operation.

In addition, the SRAM cell according to an embodiment of the present disclosure may perform a differential write operation by controlling an operation state of a control transistor through a word line connected to the control transistor.

In addition, the SRAM cell according to an embodiment of the present disclosure may prevent decrease in write efficiency due to a row half-selected cell.

In addition, the SRAM cell according to an embodiment of the present disclosure may control an operation of a control transistor to prevent data loss of a row half-selected cell caused by voltage disturbance of a BL or a BL bar.

In addition, the SRAM cell according to an embodiment of the present disclosure may determine a time where a voltage from a BL and a BL bar is sufficiently discharged within a range within which data of a row half-selected cell is not lost.

In addition, the SRAM cell according to an embodiment of the present disclosure may determine a switching time of a driving voltage of a control transistor satisfying a sufficient read stability yield of a row half-selected cell and a sufficient write ability yield of a selected cell.

In the aforementioned embodiments, the components of the present invention have been expressed in a singular or plural form depending upon embodiments thereof.

However, the singular or plural expressions should be understood to be suitably selected depending upon a suggested situation for convenience of description, and the aforementioned embodiments should be understood not to be limited to the disclosed singular or plural forms. In other words, it should be understood that plural components may be a singular constituent or a singular constituent may be plural components.

While the embodiments of the present invention have been described, those skilled in the art will appreciate that many modifications and changes can be made to the present invention without departing from the spirit and essential characteristics of the present invention.

Therefore, it should be understood that there is no intent to limit the disclosure to the embodiments disclosed, rather, the disclosure is to cover all modifications, equivalents, and alternatives falling within the spirit and scope of the disclosure as defined by the claims.

What is claimed is:

1. A Static Random Access Memory (SRAM) cell, comprising:
   a data node portion comprising four transistors constituting first and second data nodes;
   a data controller comprising first and second pass-gate transistors configured to control read and write of data in the first and second data nodes; and
   a control transistor connected to the data node portion through the second data node and configured to be controlled based on a driving voltage of a second word line having an opposite polarity to a first word line transmitting a driving voltage to the data controller, wherein the data node portion comprises first and second pull-up transistors and first and second pull-down transistors, wherein a drain terminal of the control transistor is connected to a gate terminal of the first pull-up transistor, a gate terminal of the first pull-down transistor, and a source terminal of the second pull-up transistor through the second data node, a source terminal of the control transistor is connected to a source terminal of the second pass-gate transistor and a drain terminal of the second pull-down transistor through a third data node, and a gate terminal of the control transistor is connected to the second word line, and wherein gate terminals of the first and second pass-gate transistors are connected to the first word line, a drain terminal of the first pass-gate transistor is connected to a first Bit Line (BL), and a drain terminal of the second pass-gate transistor is connected to a second BL.

2. The SRAM cell according to claim 1, wherein the first and second BLs are precharged to a voltage corresponding to a positive value before a read operation.

3. The SRAM cell according to claim 1, further comprising a word line driver configured to transmit a driving voltage corresponding to a negative value to the first word line and transmit a driving voltage corresponding to a positive value to the second word line in an initial state of operation.

4. The SRAM cell according to claim 3, wherein the word line driver transmits the driving voltage corresponding to the positive value to the first word line and transmits the driving voltage corresponding to the negative value to the second word line, at the start of a read operation.

5. The SRAM cell according to claim 4, wherein the control transistor receives the driving voltage corresponding to the negative value through the second word line to be turned off at the start of the read operation, and the first and second pass-gate transistors receive the driving voltage corresponding to the positive value through the first word line to be turned on at the start of the read operation.

6. The SRAM cell according to claim 5, wherein a charge from the first BL is discharged through the first pass-gate transistor and the first pull-down transistor during a read operation for first data corresponding to a negative value.

7. The SRAM cell according to claim 6, wherein the charge from the first BL is introduced into the first data node, and discharges a voltage of a third data node by increasing a voltage of the first data node, during the read operation for first data, and the second data node maintains a voltage of the second data node according to turn-off of the control transistor when the voltage of the first data node increases and, accordingly, the voltage of the third data node is discharged.

8. The SRAM cell according to claim 7, further comprising a read buffer portion configured to read the first data stored in the first data node using the voltage maintained in the second data node.

9. The SRAM cell according to claim 8, wherein the read buffer portion reads the second data using the voltage of the second data node maintained based on the turned-off state of the control transistor during a read operation for the second data corresponding to a negative value.

10. The SRAM cell according to claim 9, wherein a charge from the second BL is discharged through the second pass-gate transistor and the second pull-down transistor.

11. The SRAM cell according to claim 3, wherein the word line driver transmits the driving voltage corresponding to the positive value to the first word line and transmits the driving voltage corresponding to the negative value to the second word line, at the start of a write operation.

12. The SRAM cell according to claim 11, wherein the word line driver switches the driving voltage transmitted to the second word line from the negative value to the positive value when at least one of the charge from the first BL and the charge from the second BL is discharged for a predetermined time.

13. The SRAM cell according to claim 3, further comprising a signal delay processor configured to control write yield delay based on at least one inverter comprised in a write yield delay controller and control read yield delay based on at least one inverter comprised in a read yield delay controller.

14. The SRAM cell according to claim 13, wherein the signal delay processor shares an inverter delay line with a circuit generating a Sense Amplifier Enable (SAE) signal and a Word Line Enable (WLEN) signal.

15. A method of controlling an SRAM cell, the SRAM cell comprising a data node portion comprising four transistors constituting first and second data nodes; a data controller comprising first and second pass-gate transistors configured to control read and write of data in the first and second data nodes; and a control transistor connected to the data node portion through the second data node and configured to be controlled based on a driving voltage of a second word line having an opposite polarity to a first word line transmitting a driving voltage to the data controller, wherein the data node portion comprises first and second pull-up transistors and first and second pull-down transistors, wherein a drain terminal of the control transistor is connected to a gate terminal of the first pull-up transistor, a gate terminal of the first pull-down transistor, and a source terminal of the second pull-up transistor through the second data node, a source terminal of the control transistor is connected to a source terminal of the second pass-gate transistor and a drain terminal of the second pull-down transistor through a third data node, and a gate terminal of the control transistor is connected to the second word line, wherein gate terminals of the first and second pass-gate transistors are connected to the first word line, a drain terminal of the first pass-gate transistor is connected to a first Bit Line (BL), a drain terminal of the second pass-gate transistor is connected to a second BL, and wherein a word line driver switches a driving voltage transmitted to the second word line from a negative value to a positive value when at least one of a charge from the first BL and a charge from the second BL is discharged for a predetermined time.

* * * * *